United States Patent
Vladimirsky et al.

(12)

(10) Patent No.: US 6,383,697 B1
(45) Date of Patent: May 7, 2002

(54) ULTRA HIGH RESOLUTION LITHOGRAPHIC IMAGING AND PRINTING AND DEFECT REDUCTION BY EXPOSURE NEAR THE CRITICAL CONDITION UTILIZING FRESNEL DIFFRACTION

(75) Inventors: Yuli Vladimirsky; Antony Bourdillon, both of Singapore (SG)

(73) Assignee: National University of Singapore, Crescent (SG)

( * ) Notice: Subject to any disclaimer, the term of this patent is extended or adjusted under 35 U.S.C. 154(b) by 0 days.

(21) Appl. No.: 09/514,304

(22) Filed: Feb. 28, 2000

Related U.S. Application Data (60) Provisional application No. 60/151,628, filed on Aug. 31, 1999.

(51) Int. Cl.[7] .............................. G03C 5/00; G03F 9/00
(52) U.S. Cl. ..................... 430/30; 430/296; 430/311; 430/942; 430/967
(58) Field of Search ........................ 430/5, 22, 30, 430/311, 296, 942, 967

(56) References Cited

U.S. PATENT DOCUMENTS 5,898,479 A * 4/1999 Hubbard et al. ............. 355/61

* cited by examiner

*Primary Examiner*—Christopher G. Young
(74) *Attorney, Agent, or Firm*—Birch, Stewart, Kolasch & Birch, LLP (57) ABSTRACT

Ultra-high resolution lithographic imaging and printing refers to the reduction in printed feature size, or "demagnification" obtained by the use of "bias". A new meaning is given to Next Generation Lithography (NGL) in terms of fidelity in the reproduction of masks. Applying the classical manifestation of Fresnel diffraction, the mask pattern features are "demagnified" by "bias". Classically, bias is minimized but the invention uses it to advantage so that: (i) mask-wafer gaps are thus enlarged; (ii) mask features are enlarged 3×–6× for a given printed feature size (cf. classically 1:1 in proximity lithography); (iii) the technique is extensible to beyond 25 nm feature sizes and (iv) exposure times are reduced. The invention is specifically demonstrated in proximity X-ray lithography but has a generic extension to all lithographies that can use out of focus imaging to produce ultra-high resolution. In consequence of the diffraction, printing defects due to mask faults are reduced including edge roughness, writing errors, diffraction effects at shielded areas and absorber thickness variations. Moreover the exposure doses from mask features of various sizes are controlled by various techniques.

18 Claims, 7 Drawing Sheets

ULTRA HIGH RESOLUTION LITHOGRAPHIC IMAGING AND PRINTING AND DEFECT REDUCTION BY EXPOSURE NEAR THE CRITICAL CONDITION UTILIZING FRESNEL DIFFRACTION

This application claim benefit to provisional 60/151,628 filed Aug. 31, 1999

FIELD OF THE INVENTION

This invention applies to the field of micro-lithography and the application of micro-lithography as a tool in development and production of micro-electronic devices and integrated circuits.

BACKGROUND OF THE INVENTION

Lithography, the printing of patterns on surfaces, is both a driving force and a bottleneck in semiconductor manufacturing and in microfabrication. Classical lithography is based on the concept of fidelity in reproducing the mask pattern onto the wafer. Shrinking critical dimension (CD) requirements in semiconductor manufacturing demand development of lithographic techniques producing desired patterns not necessarily being a mask pattern replica.

Next Generation Lithography (NGL) implies and is here defined as the departure from the classical concept of fidelity in the replication of masks. NGL replaces the narrower term–post optical lithography.

Among NGLs competing for sub-100 nm patterning, proximity X-ray lithography (PXL) is the most advanced and mature. PXL was first introduced as a post optical lithography and unavoidably inherited the classical tendency of replication fidelity. Restricted by this concept, PXL was thought to be limited to 70–75 nm imaging and printing capability using the smallest working mask/wafer gaps of 7–10 um for practical manufacturing.

This invention makes use of the modern control over development of resists.

OBJECTS OF THE INVENTION

It is an object of the invention to perform ultra high resolution proximity lithography by demagnifying mask features on printed wafers or other surfaces.

It is the second object of the invention to perform ultra high resolution proximity lithography with mask/wafer gaps larger than are used in the prior art for printed features of a given size.

It is the third object of the invention to reduce exposure times by developing at lower overall dose levels than in the prior art.

It is the fourth object of the invention to print dense, nested or half pitch features by using multiple exposures with stepping. Typically, the stepping will be blind.

It is the fifth object of the invention to achieve ultra high resolution with feature sizes down to 25 nm, and beyond, by applying the concept of NGL.

It is the sixth object of the invention to improve critical dimension (CD) control by the use of ultra high resolution proximity lithography, including demagnifying mask features on the printed wafers or other surfaces. The improved CD control arises firstly from the comparatively large gradient of the exposure dose at an optimised development level (e.g. level B in FIG. 3) with the addition of the following objectives.

It is the seventh object of the invention to reduce edge roughness in printed features by the use of ultra high resolution in proximity lithography. The edge roughness is reduced because, in Fresnel diffraction, the image results from interference due to rays from various parts of the clear mask feature in two dimensions resulting in smoothing at rough edges.

It is the eighth object of the invention to reduce defects in printed features due to other larger mask writing defects, including overlying dust particles, by the use of ultra high resolution proximity lithography. The mechanism is similar to the above.

Figure 3:
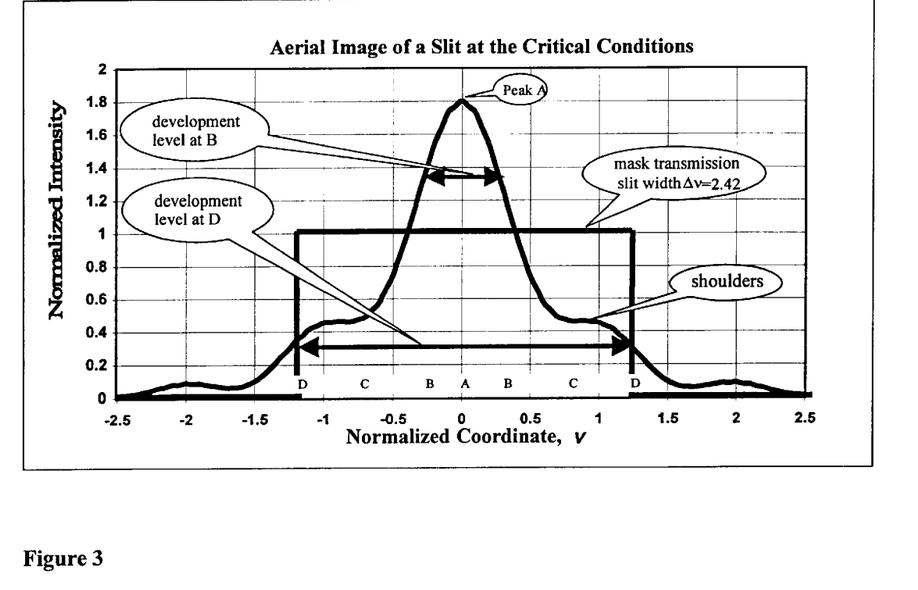
FIG. 3 illustrates the exposure dose distributed along the wafer at the Critical Condition according to the principles of the invention.

It is the ninth object of the invention to reduce CD errors in printed features by the use of ultra high resolution proximity lithography employing highly sensitive, low overall dose with concentrations at demagnified areas (e.g. level B in FIG. 3), thereby avoiding errors due to dose transmitted at shielded areas (see peak at v=2 in FIG. 3 as an example, though such peaks can be yet larger in masks with repeating clear features). These areas contain residual dose partly because of Fresnel diffraction and partly because ( as in the next objective) absorbers are not, in practice, 100% efficient.

It is the tenth object of the invention to reduce CD errors in printed features by the use of Ultra High Resolution proximity lithography employing highly sensitive low overall dose with concentrations at demagnified areas, thereby avoiding errors due to variations in absorber thickness.

It is a eleventh object of the invention to apply some or all of the above objectives to projection lithography by exposing wafers on a plane off the true image plane.

It is the twelfth object of the invention to control the exposure dose when a mask contains features of various sizes by (a) multiple exposures with stepped gaps, (b) continuous exposures with varying gap or (c) multiple exposures with more than one mask.

It is the thirteenth objective of this invention to fabricate electronic, mechanical, magnetic or any other devices by the processes described in the above objectives.

SUMMARY OF THE INVENTION

The invention includes the exposure of lithographic images with ultra high resolution resulting from demagnification: printed feature dimensions on the wafer are smaller than those on the mask. Preferably, but not necessarily, the exposure is performed near the Critical Condition (defined below) with a development level similar to level B in FIG. 3.

The invention makes use of this ultra high resolution to reduce a range of defects in lithographic printing. The reduction is due to the averaging of intensities that arises from interference (or diffraction) in the construction of mask images during lithographic printing. As the rays travel through two dimensional mask features and interfere at one dimensional developed edges in the resist, there is an averaging effect which smoothes out defects of various kinds, the chief of which are identified below.

The invention also overcomes a difficulty in ultra high resolution lithography. Because, near the critical condition, the demagnification occurs by bias, the magnification is not uniform for features of different width. Nor, therefore, is the dose uniform. The invention overcomes this fact by various techniques adapted, as appropriate, with methods listed above in the twelfth object.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF INVENTION

Next Generation Lithography (NGL) definition:

The departure from the classical concept of fidelity in the replication of masks.

This includes demagnification. Preferably, but not necessarily, the Critical Condition will be used.

Ultra High Resolution Definition

The invention capitalises upon the enhancement of resolution that results from the deliberate application of two sided bias in lithographic imaging and printing, preferably, but not necessarily, when optimised at or near the "Critical Condition", but also anywhere downstream from the mask with controlled resist processing and demagnification by bias. The term "bias" or "two sided bias" is defined as the difference between mask feature size, W, and the printed feature size, ω, i.e. the pattern width at the selected development level. More formally bias, b, is defined as follows and in formula 1 below: b=W-ω.

Ultra high resolution results from demagnification: printed feature dimensions on the wafer are smaller than those on the mask. Preferably, but not necessarily, the exposure is performed near the Critical Condition (defined below) with a development level similar to level B in FIG. 3.

Figure 1:
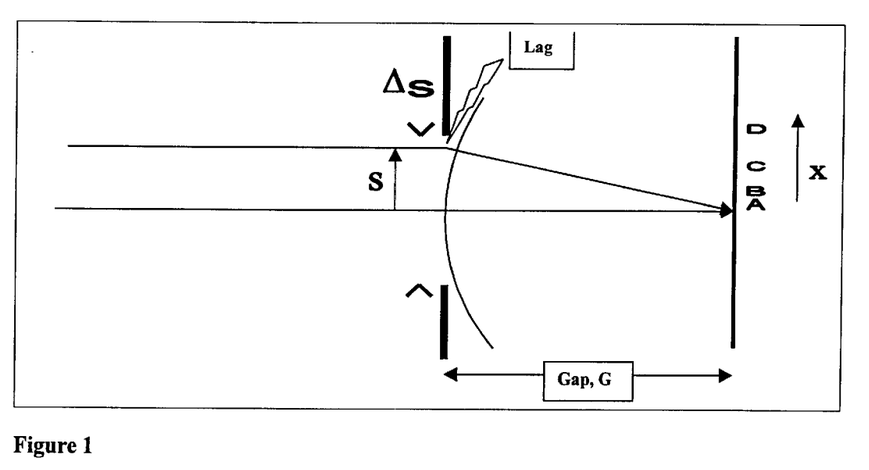
FIG. 1 is a schematic of an exposure system according to the invention including two rays of light from a distant synchrotron source passing through a slit of width Δs (corresponding to a transmitting mask feature) and constructing an image (see FIG. 2 below) at axial point A on the plane of the wafer.

The Critical Condition:

FIG. 1 shows a schematic exposure system. Rays so light from a distant point source, pass through a slit and form a Fresnel pattern, or image, at a distance G behind the slit. The various rays suffer phase lags which depend individually on their distance, s, from the center line of the slit, (i.e. the phase lags depend on $s^2/\lambda$, see FIG. 1).

FIG. 1 illustrates principles utilized by the invention including two rays of light from a distant synchrotron source passing through a slit of width Δs (corresponding to a transmitting mask feature) and constructing an image (see FIG. 2 below) at axial point A on the plane of the wafer. The upper ray suffers a phase lag proportional to $s^2/\lambda$.

Figure 2:
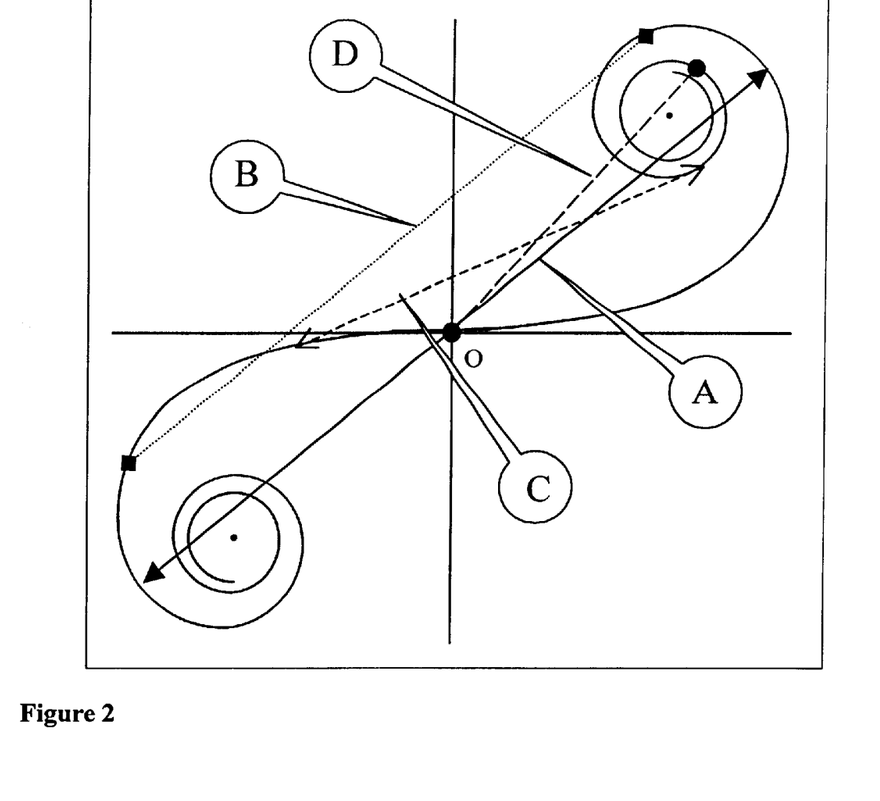
FIG. 2 illustrates a Cornu spiral utilized by the invention and showing vectors representing wave amplitudes in Fresnel diffraction at points A, B, C and D (see FIG. 1) on the plane of the wafer.

FIG. 2 illustrates a Cornu spiral showing vectors representing wave amplitudes in Fresnel diffraction at points A, B, C and D (see FIG. 1) on the plane of the wafer;

The amplitude of A is maximum since it represents the Critical Condition for which the slit width $\Delta s = 2.4\,(\lambda G/2)^{1/2}$. Scanning from the axis along the image plane in the direction of x (FIG. 1) the amplitude decreases rapidly at B, shoulders at C, and decreases rapidly again at D. Corresponding intensities are shown in FIG. 3.

More specifically, FIG. 2 shows the vectorial addition of the amplitudes of rays passing through the slit interfering constructively at points A (the axis on the image plane, see FIG. 1), B, C and D. The amplitudes are represented mathematically with Fresnel integrals or graphically with Cornu's spiral (FIG. 2), i.e. the vibration curve. The Critical Condition occurs when the width of a transmitting mask feature is related to the mask/wafer gap G and X-ray wavelength λ by the equation:

$$\frac{\Delta s}{\sqrt{\lambda G}} = 1.7 \qquad (1)$$

This condition corresponds to the maximum occurring amplitude shown as the vector A in FIG. 2. (The square of this vector gives the intensity at the image plane on the axis of the slit or clear mask feature.) The amplitudes at B, C and D (FIG. 1) on the image plane are also shown.

FIG. 3 shows the exposure dose distributed along the wafer at the Critical Condition. The exposure dose contains a sharp peak above two shoulders. The width of the peak ω is a small fraction of the spacing of the clear mask feature Δs.

Figure 4:
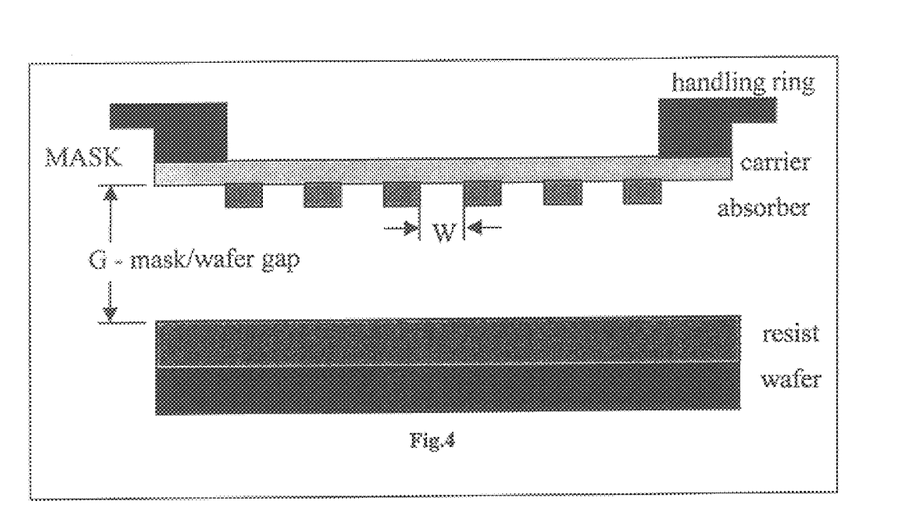
FIG. 4 illustrates the geometry of a mask and a resist coated wafer, in proximity printing, where the mask clear feature size is W and the gap is G.
Figure 5:
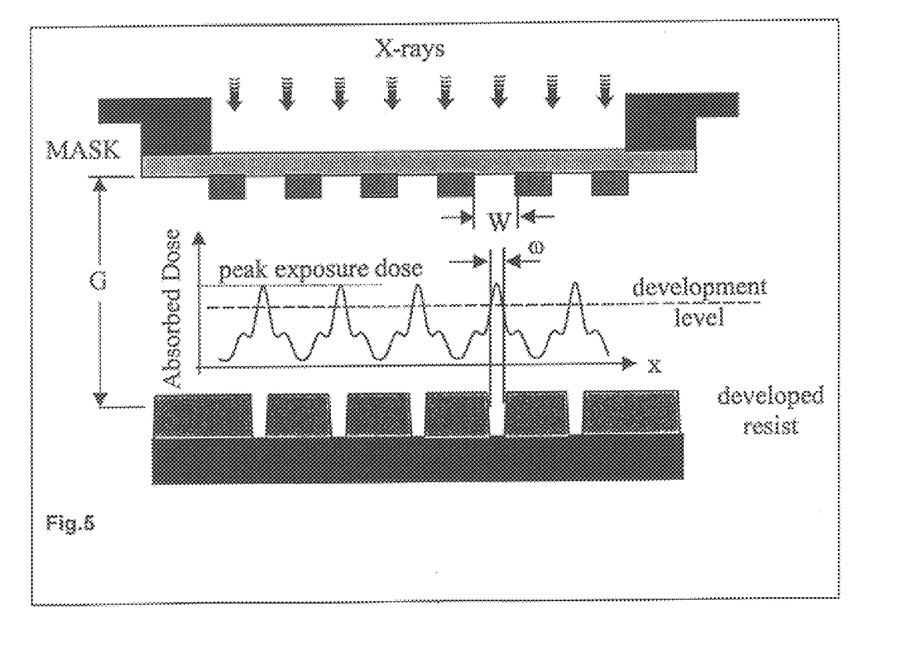
FIG. 5 is a schematic representation of the developed resist profile after exposure to x-rays according to the invention near the Critical Condition where the development level is as shown on the aerial image.

More particularly, in FIG. 3, an aerial image of a slit at the Critical Condition shows a peak at A. Also shown are a 4× demagnified image of the slit at development level B (as in FIG. 1) and a 1:1 image at the development level D. The normalised co-ordinate $v = x(2/G\lambda)^{1/2}$ at the wafer and corresponds to $2.42 = \Delta s(2/G\lambda)^{1/2}$ at the mask, where the transmission is shown Demagnification Exposure Schemes FIG. 4 shows the geometry of mask and resist coated wafer, in proximity printing, where the mask clear feature size is W (W=Δs) and the gap is G FIG. 5 shows a schematic representation of the developed resist profile after exposure to x-rays near the Critical Condition where the development level is as shown on the aerial image (middle image). The two sided bias b=W-ω, where ω is the printed feature size, i.e. the pattern width at the selected development level.

Figure 6:
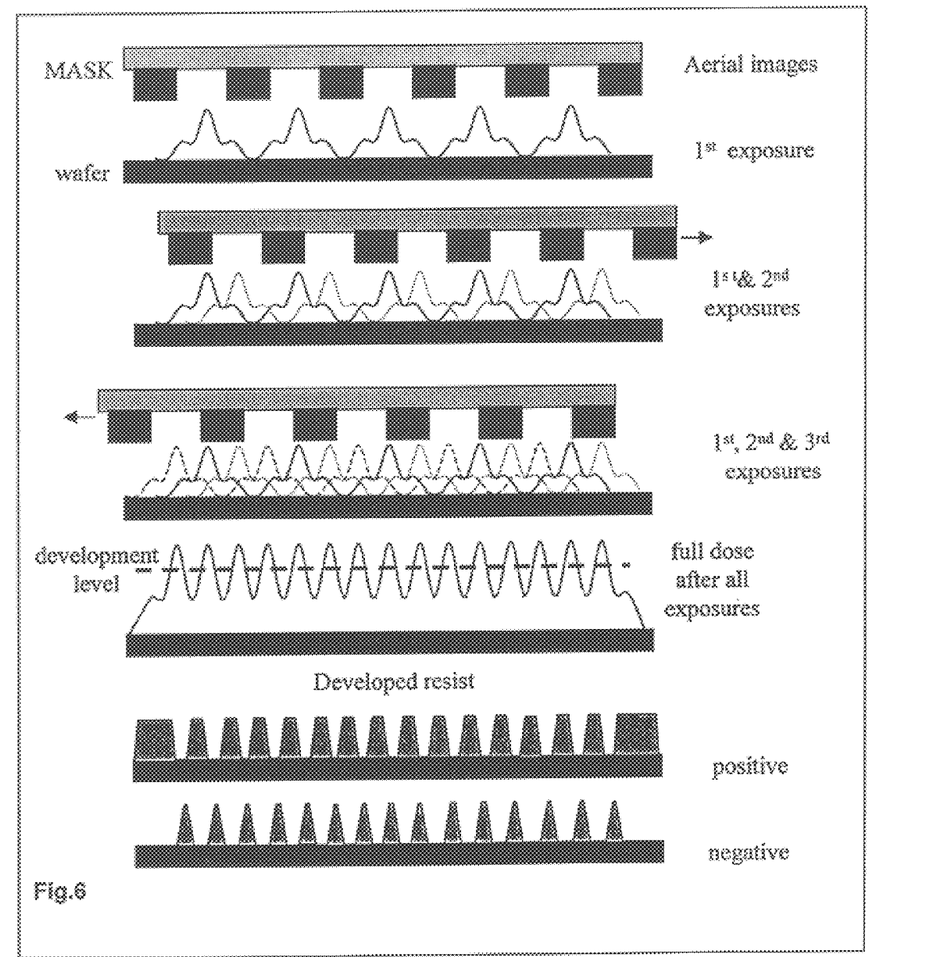
FIG. 6 illustrates the nesting of features obtained by the invention with multiple exposures on either negative or positive resists by stepping of wafer/mask alignment.

FIG. 6 shows the nesting of features obtained with multiple sequential exposures on either negative or positive resists by stepping of the wafer/mask alignment and single development step.

Preferred Procedure

Figure 9:
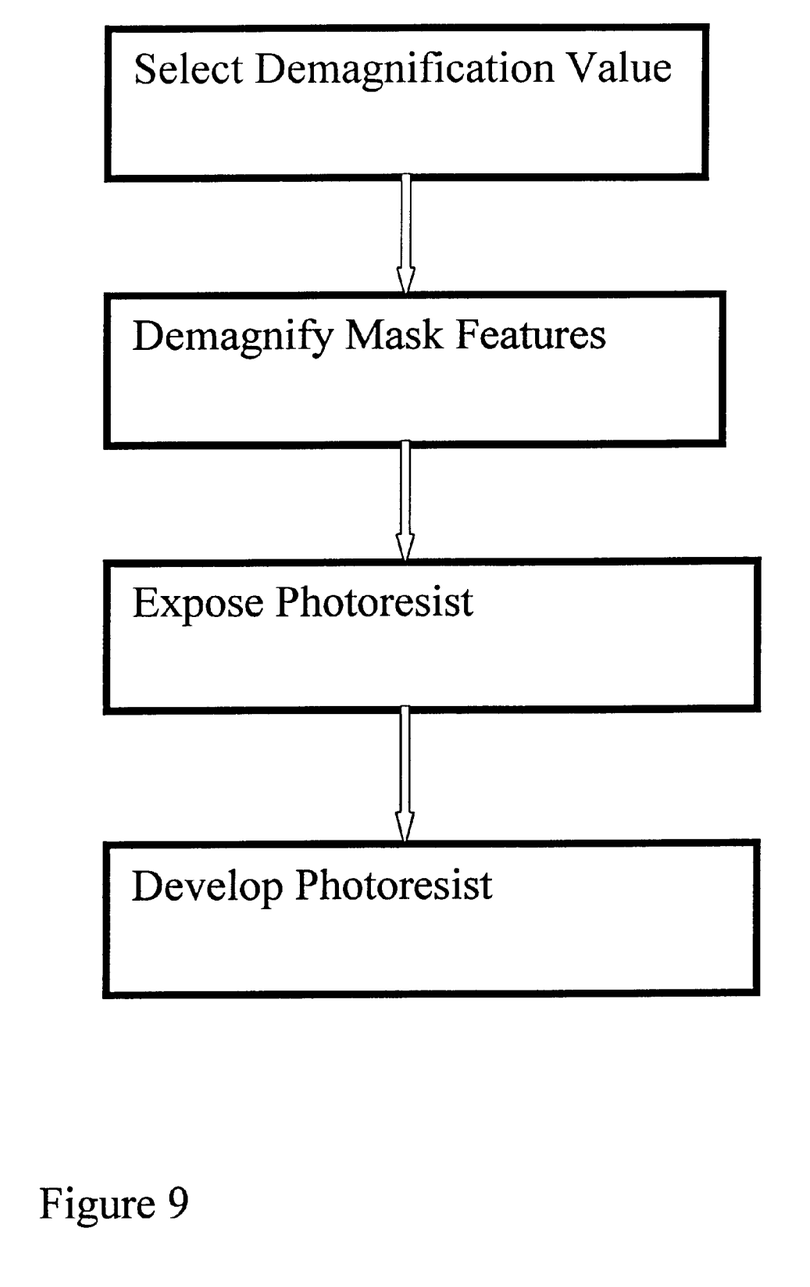
FIG. 9 is a high-level flowchart showing the inventive procedure.

FIG. 9 is a high-level flowchart illustrating the preferred procedure. As shown therein, the procedure includes selecting a demagnification value, demagnifying the mask features, exposing the photoresist with the demagnified mask features, and developing the exposed photoresist. The features of the mask are demagnified by placing the mask relative to the photoresist such that a gap width G is formed therebetween and such that the photoresist is not disposed at a real image plane relative to the mask and an exposure source. Utilizing the above principles, further details of this preferred procedure are presented below:

1. For a desired pattern feature size, ω, and mask feature size, W,
    select a demagnification between 1× and 6× as follows.
2. Using Fresnel diffraction analysis and assuming a development at some given level typically 90% of peak exposure dose, but between 25% and 100% of the peak exposure dose (see FIG. 3)
    calculate the two sided bias needed to achieve this demagnification
3. Using this calculated two sided bias and the dimensionless spatial coordinate (defined below) of value preferably, but not necessarily, around 2.42, or between 1.4 and 3.0 for wavelengths within the illumination band width (typically wavelengths between 1.2 nm and 0.6 nm) used for the exposure
    calculate the optimum gap width G (FIG. 3 and formula 2)
4. Set the gap to this optimum
5. Parametrize the exposure dose and development procedure to obtain development at the level (typically 90% of the peak dose) selected in step 2. Use the optimum exposure dose in the following Procedures 6–7.
6. If dense linewidth/pitch ratios are required, expose the resist at the optimum gap (step 4) and exposure (step 5, FIG. 5), nesting the prints as required (FIG. 6) by using conventional equipment such as a stepper that steps the mask
7. Develop the resist using the optimized development appropriate to the already optimized exposure dose.

$$b \approx 2f(I)\sqrt{G\lambda/2}. \quad \text{Formula 2:}$$

Dimensionless spatial coordinate, $$v = s\sqrt{\frac{2}{G\lambda}} = \sqrt{2N_F}, \Delta v = \Delta s\sqrt{\frac{2}{G\lambda}}$$

Where:
  b is the two sided bias (FIG. 5)
  s is a distance measured from the axis of the slit/clear mask feature in its plane (FIG. 1)
  G is the width of the mask/wafer gap (FIG. 4)
  λ is the wavelength of the radiation used, and
  $N_F$ is the number of Fresnel half zones across the slit/clear mask feature
  f(I) is a function of the intensity of the aerial image (e.g. FIG. 3. Notice that f depends on the intensity selected for the development, through exposure time and resist processing, and f depends also on the shape of the aerial image
  v is a dimensionless spatial coordinate
  Δs is the slit width (equal to W)
  Δv is the dimensionless spatial coordinate corresponding to Δs at a given G and λ..

Experimental Exposures With Demagnification

Figure 7:
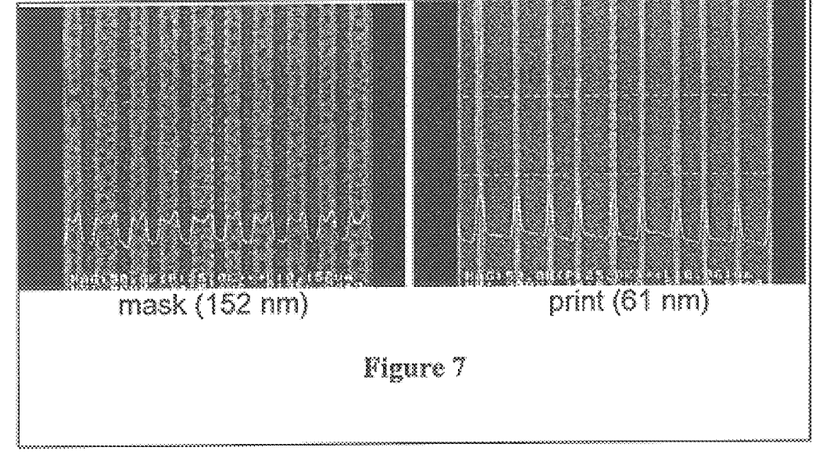
FIG. 7 illustrates 3× demagnification demonstrated in a negative resist exposed through an X-ray mask according to the invention.

FIG. 7 shows 3× demagnification demonstrated in a negative resist exposed through an X-ray mask. Edges are smoothed, CD control is enhanced and other mask defects are reduced in the image.

Figure 8:
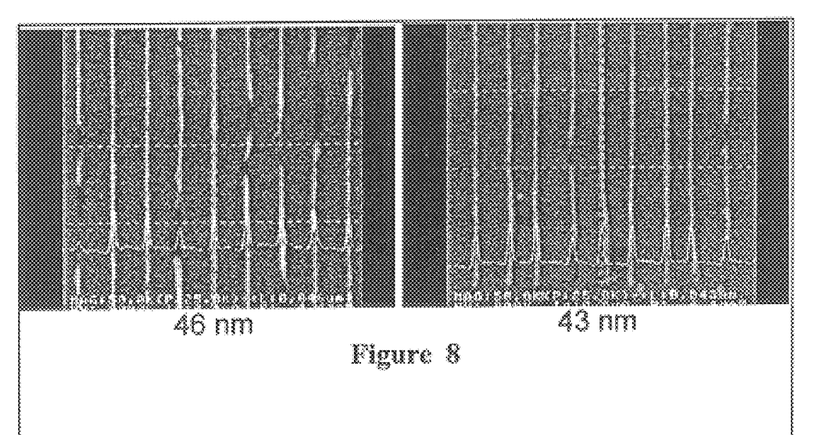
FIG. 8 illustrates 3.5× demagnification demonstrated in a negative resist exposed through an X-ray mask according to the invention.

Specifically, in FIG. 7,. 61 nm lines are printed in a SAL 605 negative resist using mask with 180 nm nominal line/space features (360 nm period) FIG. 8 shows 3.5× demagnification demonstrated in a negative resist with feature sizes of 43 nm. The excessively high aspect ratio of the resist has led to mechanical failure which is corrected by thinner resist layers.

Specifically, in FIG. 8, lines smaller than 50 nm are printed in a SAL 605 negative resist using 152 nm lines on a mask (same mask as in FIG. 7.) Mechanical failure in resist is due to high aspect in over-thick resist. Moreover, the invention can use bias to print fine features with larger mask/wafer gaps, up to 30 micrometers and above if desired, than are required in conventional 1:1 proximity printing for equivalent feature sizes. The invention further includes the use of bias to provide extensibility of 1 nm proximity lithography for printed feature sizes down to 25 nm and beyond, preferably with mask/wafer gaps greater than 5 micrometers.

The invention also permits the selection of desired development levels associated with selected demagnification.

The use of Fresnel diffraction in the demagnified image reduces CD errors due to exposure with an aerial image of high intensity gradient at a selected level of development. The use of Fresnel diffraction in the demagnified image also reduces the edge roughness in the printed image as well as printing errors due to other mask writing defects. Using Fresnel diffraction in the demagnified image reduces critical dimension (CD) errors by developing the photoresist at high development levels with low overall exposure dose, the errors being due to light in the shielded areas resulting from diffraction and absorber transmission, including variations due to non-uniform absorber thickness. In this invention, when a mask contains features of various sizes the exposure dose is controlled by (a) multiple exposures with stepped gaps, (b) continuous exposures with varying gap or (c) multiple exposures with more than one mask.

This invention may use electromagnetic waves to expose the resist, including X-rays, as well as particles, including electrons and ions, of whatever wavelength.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

What is claimed is:

1. An ultra-high resolution proximity lithographic method for exposing a photoresist with a mask, comprising:
    demagnifying mask features utilizing Fresnel diffraction by placing the mask relative to the photoresist such that a gap width is formed therebetween and such that the photoresist is not disposed at a real image plane relative to the mask and an exposure source; and
    exposing the photoresist with the exposure source, wherein the exposed photoresist features are smaller than the mask features.

2. The method according to claim 1, further comprising:
    selecting a demagnification value, said demagnifying step demagnifying mask features at the demagnification value.

3. The method according to claim 2, said selecting step selecting the demagnification value from a range of 1x to about 6x.

4. The method according to claim 2, said selecting step including:
calculating a two sided bias for demagnifying mask features at the selected demagnification value; and
calculating the gap width between the mask and the photoresist.

5. The method according to claim 4, further comprising:
setting the gap width to the calculated gap width.

6. The method according to claim 4, said two sided bias calculation step including:
assuming a development level utilized by said exposing step; and
applying Fresnel diffraction analysis using the assumed development level to calculate the two sided bias for demagnifying mask features at the demagnification value.

7. The method according to claim 4,
said two sided bias and gap width calculation steps utilizing the following equations:

$$b \approx 2f(I)\sqrt{G\lambda/2}$$

$$v = s\sqrt{\frac{2}{G\lambda}} = \sqrt{2N_F},$$

$$\Delta v = \Delta s\sqrt{\frac{2}{G\lambda}}$$

wherein:
b is the two sided bias,
s is a distance measured from an optical axis to a slit/clear mask feature,
G is the calculated gap width,
$\lambda$ is the wavelength of the radiation used, and
$N_F$ is the number of Fresnel half zones across the slit/clear mask feature
$f(I)$ is a function of the intensity of an aerial image,
v is a dimensionless spatial coordinate
$\Delta s$ is the slit width (equal to W)
$\Delta v$ is the dimensionless spatial coordinate corresponding to $\Delta s$ at a given G and $\lambda$.

8. The method according to claim 7, wherein the dimensionless spatial coordinate $\Delta v$ ranges between 1.4 and 3.0 for any wavelength $\lambda$ of electromagnetic waves or particles.

9. The method according to claim 8, wherein the dimensionless spatial coordinate $\Delta v$ is about 2.4 for any wavelength $\lambda$ of electromagnetic waves or particles.

10. The method according to claim 1, further comprising:
developing the photoresist.

11. The method according to claim 1, said exposing step exposing the photoresist without lenses by passing electromagnetic waves through the mask.

12. The method according to claim 10, wherein the electromagnetic waves are X-rays with a resolution between 10 micrometers and about 20 nanometers.

13. The method according to claim 1,
said exposing step exposing the wafer by passing ions or particles through the mask.

14. The method according to claim 1,
said exposing step controlling an exposure dose by performing multiple exposures with stepped gaps when the mask contains features of various sizes.

15. The method according to claim 1,
said exposing step controlling an exposure dose by performing continuous exposures with stepped gaps when the mask contains features of various sizes.

16. The method according to claim 1,
said exposing step controlling an exposure dose by performing multiple exposures with more than one mask when the mask contains features of various sizes.

17. A device produced by the method according to claim 1.

18. The method according to claim 1, wherein the step of demagnifying, the exposure source includes at least two rays, and one of the two rays undergoes a phase lag with respect to another one of the two rays upon passing through the mask.

* * * * *